Sept. 26, 1961 C. E. MAIDEN ET AL 3,002,133

MICROMINIATURE SEMICONDUCTOR DEVICES

Filed Oct. 19, 1959

CLINTON E. MAIDEN,
ELMO E. MAIDEN,
INVENTORS.

BY Spensley and Horn

ATTORNEYS

United States Patent Office 3,002,133
Patented Sept. 26, 1961

3,002,133
MICROMINIATURE SEMICONDUCTOR DEVICES

Clinton E. Maiden and Elmo E. Maiden, Canoga Park, Calif., assignors to Pacific Semiconductors, Inc., Culver City, Calif., a corporation of Delaware Filed Oct. 19, 1959, Ser. No. 847,355
8 Claims. (Cl. 317—234)

This invention relates to semiconductor devices and more particularly to improved microminiature rectifiers.

In the semiconductor art a region of semiconductor material containing an excess of donor impurities and yielding an excess of free electrons is considered to be an impurity doped N-type region. An impurity doped P-type region is one containing an excess of acceptor impurities resulting in a deficit of electrons, or an excess of holes. Stated differently an N-type region is one characterized by electron conductivity, whereas a P-type region is one characterized by hole conductivity. When a continuous solid crystal specimen of semiconductor material has an N-type region adjacent a P-type region the boundary between the two regions is termed a P-N or N-P junction, or simply a junction. Such a specimen of semiconductor material is termed a junction semiconductor device and may be used as a rectifier. In addition to the junction type semiconductor devices, the point contact type and diffused junction type semiconductor devices are also now well known to the art.

The term semiconductor material as utilized herein is considered generic to germanium, silicon, and germanium-silicon alloys, and is employed to distinguish the semiconductor material from metallic oxide semiconductors such as copper oxide and selenium.

As the art of miniaturization has developed in the electronics industry, it has been found necessary to reduce still further in size glass-to-metal packages housing the semiconductor devices. Inasmuch as the active crystal element of a semiconductor diode, for example, amounts to but a very small fraction of the total volume of the completed package, it is clear that as the volume of the package approaches that of the crystal the more nearly the optimum miniaturization will be achieved. In addition to decreasing the size, recently developed uses for semiconductor devices have made necessary greatly increased reliability in the freedom of the devices from mechanical or electrical failure when subjected to abusive use and environmental conditions.

The prior art devices are typically housed in packages which involve a glass-to-metal seal requiring close manufacturing tolerances. Whisker contact must generally be made to one surface of the crystal which imposes a further manufacturing problem due to the tolerances which must be maintained. Due to such limitations the present art semiconductor crystal devices are expensive to manufacture and are often not as reliable as desired. By the most common prior art, encapsulation methods and techniques whereby the active elements of the device are packaged in glass, glass-metal, ceramic, or plastic cases, the reliability of the device and its possibility of failure due to environment and conditions of use is dependent upon reliability of the protective housing. That is, the encapsulation or housing must form an hermetic seal about the crystal element of the semiconductor device mounted therein to protect the device from the adverse effects of ambient moisture. This particular requirement is especially critical when the crystal element of the semiconductor device is composed of an intrinsic semiconductor such as germanium or silicon which is particularly sensitive to even slight increases or changes in humidity.

In addition, prior art methods of constructing diodes which make use of a whisker assembly in contact with the semiconductor crystal element are inherently sensitive to shock and vibration, and the power dissipating capacity of the device is limited due to the cross-sectional area and current carrying capacity of the whisker element.

Accordingly, it is a primary object of the present invention to provide an improved semiconductor diode which is at least an order of magnitude smaller than existing prior art devices.

It is another object of the present invention to provide such a miniaturized semiconductor diode having electrical characteristics equivalent to diodes of much greater size.

It is another object of the present invention to provide a semiconductor diode the total encapsulated size of which approaches that of the active crystal element.

Yet another object of the present invention is to provide a miniaturized semiconductor diode having a maximum power dissipation relative to its size.

It is a still further object of the present invention to provide a very small semiconductor device which lends itself to ease and economy of manufacture.

It is yet another object of the present invention to provide a very small semiconductor diode which requires fewer and less critical operations during manufacture.

In accordance with the basic concept of the present invention in its presently preferred form, there is produced in accordance with well-known prior art techniques, such as fusion or diffusion, a P-N junction semiconductor crystal. To opposite surfaces of the crystal there is ohmically connected first and second lead wires which are of ribbon-shaped configuration. The ribbon leads are of a width approximately equal to the width of the crystal element and are directly bonded to substantially the entire surface thereof. The active portions of the device, that is, the portions of the device proximate the crystal element are coated with a hermetically sealing material. The leads are substantially planar or ribbon-shaped in the portion thereof in surface contact with the crystal element but may take any configuration at the portion extended away from the crystal element.

While the novel and distinctive features of the invention are particularly pointed out in the appended claims, the more expository treatment of the invention in principle and in detail, together with additional objects and advantages thereof, is afforded by the following description and accompanying drawing in which like reference characters are used to refer to like parts throughout the several views.

Figure 1:
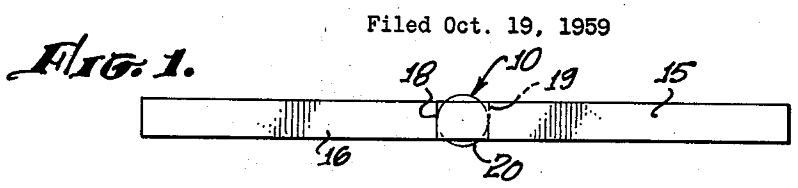
FIGURE 1 is a plan view of a presently preferred embodiment of a diode constructed in accordance with the present invention prior to the formation of the encapsulation thereon.
Figure 2:
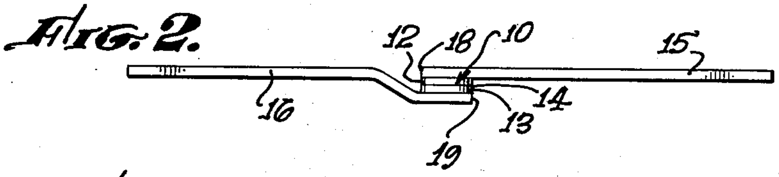
FIGURE 2 is a view in elevation corresponding to FIGURE 1.

Referring now to the drawing and more particularly to FIGURES 1 and 2, there is shown a semiconductor crystal body 10 which in this embodiment is formed of silicon. The crystal body 10 includes a P-type conductivity region 12 and an N-type conductivity region 13 separated by a P-N junction 14. The P-N may be produced by any method known to the art such as by alloying or diffusion techniques, for example. The invention is equally applicable, however, to semiconductor electrical translating devices which do not necessarily include a P-N junction but which nevertheless provide rectification at a barrier such as is formed by the disposition of a film on the surface of a semiconductor body. Such a film may permit the device to exhibit diode action or even exhibit the characteristics of a voltage sensitive variable capacitor.

In the illustrative embodiment shown in FIGURES 1 through 5, leads 15 and 16 are ohmically bonded to opposite surfaces of the crystal 10 such that one lead is in ohmic contact with the P-type conductivity region 12 while the other lead 16 is in contact with the N-type conductivity region 13. In its presently preferred form the leads 15 and 16 are ribbon-shaped throughout. That is, the cross-sectional configuration of the leads 15 and 16 is rectangular. The width of the leads is approximately equal to the diameter of the crystal 10. The leads are affixed to the opposite surfaces of the crystal 10 such that the lead is in contact with substantially the entire surface of the crystal. Thus, the inner end 18 of the first lead 15 is extended across the crystal substantially to the point tangential to the circular crystal as shown, while the inner end 19 of the second lead is extended from the opposite direction to the opposite tangential point of the crystal 10. Thus, as shown in FIGURES 1 and 2, the rectangularly cross-sectioned leads 15 and 16 cover substantially the entire surface area of the crystal 10 and leave exposed only a small portion of the crystal surfaces, which extend beyond the width of the leads 15 and 16, and the circumferential edge surface 20 of the crystal.

In the presently preferred embodiment, the ribbon-shaped leads are formed from a metal having proper physical and electrical properties, such as nickel, molybdenum, or Kovar. In this embodiment nickel is used. The nickel leads are plated with a predeposited coating of gold about the entire outer surface thereof, since the gold plating makes possible an easier and better low resistance contact between the leads and the surfaces of the crystal 10. That is, the leads 15 and 16 are bonded to opposite surfaces of the crystal and extend in opposite directions from the crystal substantially co-planar as described hereinafter. The ohmic bonding of the leads 15 and 16 to the crystal can be accomplished by methods well known to the art. One such method when the leads are coated with gold is to form the bond between the crystal and the leads by placing the crystal and leads under pressure in a furnace and heating to a temperature sufficient to cause alloying between the silicon and the gold to produce a silicon-gold eutectic or an alloy region. Temperatures of approximately 450° C. may be suitably employed at pressures of 800 to 1000 p.s.i. between the leads and crystal to cause bonding of the leads to the crystal surfaces. In addition, it has been found advantageous to slightly dope the gold coating which is deposited upon the nickel leads with an active impurity of the same type as that of the semiconductor crystal region with which the metal lead is to make contact. Thus, the lead 15 which is ohmically bonded to the P-type conductivity region, for example, is doped with a P-type conductivity impurity in the gold layer; such a dopant might be boron, for example. The other lead is doped with an N-type conductivity impurity such as arsenic, for example.

As shown in FIGURES 1 and 2, the leads 15 and 16 extending in opposite directions from the crystal are preferably formed co-planar by bending one of the leads 16 upward until the extending portion of the lead lies substantially in the same plane as the upper lead 15. Thus, the leads extending from the crystal lie in substantially the same plane and along the common longitudinal center line of the device.

After the leads 15 and 16 have been ohmically connected to opposite surfaces of the crystal 10 a thin protective film is formed upon the device to cover and protect the device from the ambient at the exposed parts of the crystal 10. That is, a relatively thin esterified film, i.e., less than one micron in thickness, is formed on the semiconductor crystal, in accordance with the methods described and claimed in co-pending U.S. patent application entitled "Improved Surface Treatment of Semiconductor Bodies," by Allan L. Harrington and Stanley Pessok, Serial No. 749,624, which is assigned to the assignee of the present invention. The film 30 as shown diagrammatically is greatly enlarged for purposes of illustration in FIGURE 3 and surrounds the active crystal element to protect the element and the associated ohmic contacts from the ambient atmosphere.

In order to form the thin esterified film, the sub-assembly is immersed in an etch solution containing hydrofluoric acid as a principal element for a length of time sufficient to remove foreign matter, contaminants and work damage from the surface of the crystal body. The etch solution contains, for example, two parts by volume of hydrofluoric acid (about 40% concentration in water) and one part of nitric acid (about 90% concentration in water). After etching the sub-assembly is immediately immersed in a quench solution comprising primarily an organic liquid which has in its chemical structure a reactive hydroxyl group, broadly designated herein as $R(OH)_x$, specifically, a monohydric or polyhydric aliphatic alcohol containing from 1 to 4 carbon atoms per molecule. A 95% ethanol solution is particularly preferred. It is necessary to transfer the sub-assembly including the silicon body quickly from the etch solution to the quench solution to prevent undue exposure to the ambient. Briefly, hydrofluoric acid ($H_2SiF_6$) formed at the silicon surface when the body is immersed in the quench solution will react with the hydroxyl radical at the silicon surface to form ester groups which are molecularly bonded with the silicon as a film upon the silicon surface. The film is less than one micron, and normally on the order of 100 to 1000 angstrom units, in thickness. Quenching times ranging from about five seconds to five minutes may be suitably employed.

Figure 3:
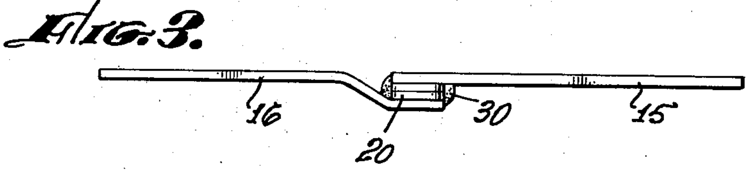
FIGURE 3 is a view corresponding to FIGURE 2 after formation of a protective coating upon the active crystal element.
Figure 4:
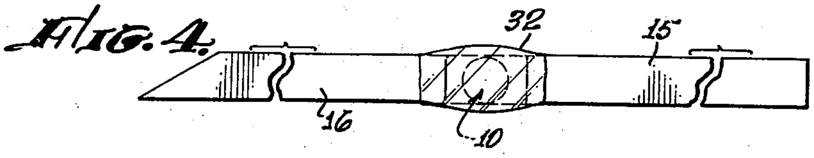
FIGURE 4 is a plan view of a completed and encapsulated device in its presently preferred form.
Figure 5:
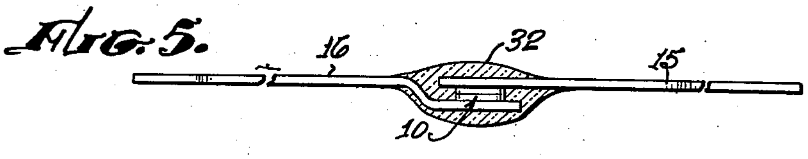
FIGURE 5 is a view in elevation partly in section corresponding to FIGURE 4.

After formation of the device, as shown in FIGURE 3, with a thin protective film formed thereon which protects the active crystal element and bonded areas from the ambient, an encapsulating material is formed upon the device to afford physical strength and long term protection from the ambient. Such materials include epoxy resins, polysiloxanes, glass, ceramics, or similar material which will provide added strength for the device.

One such material which has been found particularly advantageous is heat stable, modified-silicone, electrical insulating dipping and impregnating varnish such as that manufactured under the trade name "Sylkyd 1400 varnish" by the Dow Corning Corp. This varnish is a resin solution which has a clear straw color and includes 40% solids content solvent solution with a viscosity of 400–800 centipoises. Upon exposure to elevated temperatures, the varnish cures into a tough resilient film, which will darken depending upon the temperature and degree of cure. Exposure of devices so coated to elevated temperatures indicates that this particular polymer forms no thermal decomposition products that are detrimental to the electrical characteristics. In fact, the characteristics generally improve after high temperature storage. The chemical composition of this varnish is approximately 80% organic polymer modified with approximately 20% silicone. The organic portion consists namely of a co-polymer of dimethyl terephthalate, glycerin and ethylene glycol. The silicone portion is diphenyl dimethoxy silane. To encapsulate the device with modified silicone varnish, for example, the device having the thin protective film 30 thereon is transferred to a dry box and heated by infra red lamps at approximately 100° C. to evaporate any alcohol remaining from the quench. The diode is then coated with the "Sylkyd" varnish by painting the diode with a glass tipped rod. The modified silicone varnish is cured by drying the coated device at approximately 75° C. for 16 to 24 hours. The final cure is then made by heating at approximately 175° C. for 200 hours or 200° C. for 24 hours.

Thus, the finished device comprises an encapsulated diode which is not substantially greater in size than the bare device including the crystal element. Illustrative of the size of the device is the presently preferred embodiment in which the crystal is 0.020" in diameter and 0.006" thick. The leads 15 and 16 are 0.0035 x 0.019 x 0.625" in length. The encapsulating package is 0.020 to 0.035" in diameter by 0.050 to 0.100" in length giving the silicone varnish encapsulation a thickness of 0.001 to 0.014 around the crystal element. The electrical characteristics of the illustrative device are: $I$=15 ma., $E_s$ at 100 ma. 50 v., and reverse recovery to 100K in 1.0 microsecond.

After formation of the thin film 30 comprising an ester of the underlying silicon material, the device can be completed by forming thereon as a final encapsulation a polysiloxane film 32 of substantial thickness as described in copending application Serial No. 749,620, entitled "Method and Means for Forming Passivation Films on Semiconductor Bodies," by Allan L. Harrington and Stanley Pessok, assigned to the assignee of the present invention as an alternative embodiment of the present invention. In order to produce the relatively thick film the pre-esterified semiconductor surface, herein silicon, for purposes of example, is reacted with polyfunctional organo-silicon monomers to produce cross-linked or space polymers integrally bonded to the silicon surface. The major reactive ingredient in the polymerization reaction is a tri-functional organo-silicon compound having the general formula: $RSiX_3$ where R is a mono-valent hydrocarbon radical (e.g., methyl, ethyl, phenyl, epoxy, vinyl, nitrile, etc.), and X is a reactive group capable of propagating a chain and cross-linking it to other chains. Among the many examples of suitable compounds are ethyl triethoxy-silane, methyl triethoxysilane, phenyl trihydroxy-silane, and the like.

In addition to the tri-functional compound, various amounts of di-functional and/or monofunctional organo-silicon monomers are included to modify the mechanical and electrical properties of the resulting cross-linked polymer. More particularly, the ester is reacted by reacting the ester groupings and the surface of the semiconductor material, in the thin film formed thereon, with a mixture comprising tri-functional silane monomers and mono or di-functional monomers, or both, in predetermined proportion; together with reactive and inert catalysts as described in detail hereinafter. The body is immersed in the liquid monomeric mixture in this embodiment and the mixture is agitated to insure complete wetting of the surface. Other methods of wetting can, of course, be utilized as long as the wetting action is complete.

The esterified film is reacted with a mixture of organo-silane compounds, in which a tri-functional monomer predominates. The reactive group X of such monomers having the formula $RSiX_3$ can be any of a wide variety. The most reactive is the hydroxyl group but trihydroxy compounds have the disadvantage that they rapidly auto-polymerize. Consequently, it is preferred to use, as a starting material, a tri-alkoxy compound such as ethyl triethoxysilane and hydrolyze the alkoxy compound to the hydroxy compound just prior to use. Such hydrolysis may be effected in a medium of water, amyl alcohol, toluene (which is a solvent for the hydrolysis products) and hydrogen chloride, which acts as a catalyst.

Thus, an illustrative quench solution comprises an alcohol solution which can be broadly designated as $R(OH)_x$ in which R is a hydrocarbon radical, preferably containing one to four carbon atoms. Hydrofluoric acid ($H_2SiF_6$) forms at the silicon surface when the silicon is immersed in the quench solution and will react with the hydroxyl groups at the silicon surface to form an esterified film 30 which is molecularly bonded with the silicon as a film upon the surface thereof. This film is synthesized by condensation polymerization of the Si—O linkages 500 angstroms in thickness. Thereafter the film 32 is produced by the generation by co-polymerization of a mixture of poly-functional, organo-silicon monomers which interact and react with the silicon semiconductor surface and the thin film formed thereon by the above described previous treatment to yield a space polymer which is integral with the previously treated and real surface of the semi-conductor body 10. The monomeric organo-silicon materials in accordance with this invention are more fully described in the co-pending U.S. patent application Serial No. 749,620, now Patent No. 2,913,358.

Figure 6:
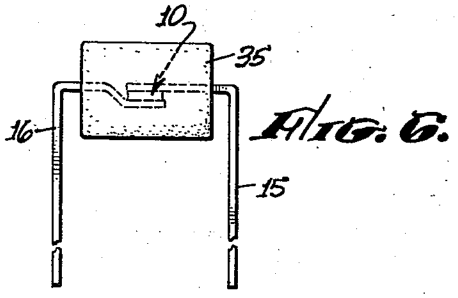
FIGURE 6 is a view in elevation of an alternative embodiment of the present invention.
Figure 7:
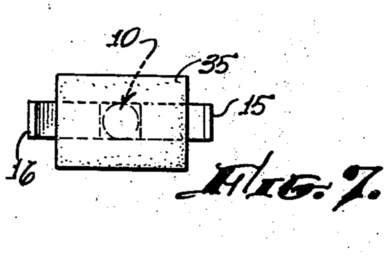
FIGURE 7 is a plan view corresponding to FIGURE 6.

In addition to the encapsulation means described above, others can be used such as, for example, glass encapsulation and by surrounding the diode with a protective sleeve. The diode can also be encapsulated by potting the device with various potting compounds such as epoxy resins, ceramics, plastics, or metal with and without fillers. One such illustrative encapsulation is shown as an alternative embodiment in FIGURES 6 and 7. In this embodiment an aluminized ceramic sleeve 35 is positioned surrounding the diode. The space between the diode and the interior wall of the sleeve 35 is then filled with a potting compound such as an epoxy resin. This embodiment, for example, is .050 inch in diameter and .080 inch in length with the leads bent parallel at a spacing of 1.0 inch. When filler materials are used in combination with potting material or protective film such fillers include materials such as cerium oxide, aluminum oxide, zirconium orthosilicate, zirconium oxide, silicon dioxide, mica and talc.

Thus, the present invention provides an improved semiconductor diode which is miniaturized such that the overall size of the active crystal elements can be minimized and which can be efficiently manufactured with a minimum of critical operations.

What is claimed is:

1. An improved semiconductor device comprising: a semiconductor crystal element having first and second opposed contact surfaces, said first surface being of one conductivity type, said second surface being of a second conductivity type; first and second leads each having a portion longitudinally extending from one end thereof which portion defines a substantially planar surface; said planar surface of said first lead being directly bonded in ohmic connection to said first surface, said planar surface of said second lead being directly bonded in ohmic connection to said second surface, and an esterified surface formed on said crystal at those portions of the crystal surface not in contact with said leads.

2. An improved semiconductor device comprising: a semiconductor crystal element having first and second opposed contact surfaces, said first surface being of one conductivity type, said second surface being of a second conductivity type; first and second electrically conductive leads, each of said leads having a portion longitudinally extending from one end thereof which portion defines a substantially planar surface; said planar surface of said first lead being directly bonded in ohmic connection to said first surface, said planar surface of said second lead being directly bonded in ohmic connection to said first surface, said first and second leads being extended in substantially opposed directions from said crystal, and an esterified surface formed on said crystal at those portions of the crystal surface not in contact with said leads.

3. An improved semiconductor device comprising: a semiconductor crystal element having first and second opposed contact surfaces, said first surface being of one conductivity type, said second surface being of a second conductivity type; first and second leads each having a portion longitudinally extending from one end thereof which portion defines a substantially planar surface; said planar surface of said first lead being directly bonded in ohmic connection to said first surface, said planar surface of said second lead being directly bonded in ohmic connection to said second surface, an esterified surface formed on said crystal at those portions of the crystal surface not in contact with said leads, and an encapsulating moisture impervious, electrically insulating material surrounding said crystal and adjacent portions of said leads in direct contact with said crystal and leads.

4. An improved semiconductor device comprising: a semiconductor crystal element having first and second opposed contact surfaces, said first surface being of one conductivity type, said second surface being of a second conductivity type; first and second electrically conductive leads, each of said leads having a portion longitudinally extending from one end thereof which portion defines a substantially planar surface; said planar surface of said first lead being directly bonded in ohmic connection to said first surface; said planar surface of said second lead being directly bonded in ohmic connection to said first surface, said first and second leads being extended in substantially opposed directions from said crystal, and an esterified surface formed on said crystal at those portions of the crystal surface not in contact with said leads, and an encapsulating moisture impervious, electrically insulating material surrounding said crystal and adjacent portions of said leads in direct contact with said crystal and leads.

5. An improved semiconductor diode comprising: a semiconductor crystal element having a P-type conductivity contact surface and an opposed substantially parallel N-type contact conductivity surface; first and second electrically conductive leads, said leads being ribbon-shaped with a substantially rectangular cross-sectional configuration, said leads being approximately equal in width to the width of said contact surfaces of said crystal, said leads being directly bonded proximate one end thereof to said first and second contact surfaces in ohmic connection with substantially the entire contact surface thereof, said leads being extended from said crystal in substantially opposed parallel directions, and an esterified surface formed on said crystal at those portions of the crystal surface not in contact with said leads.

6. An improved semiconductor diode comprising: a semiconductor crystal element having a P-type conductivity contact surface and an opposed substantially parallel N-type contact conductivity surface; first and second electrically conductive leads, said leads being ribbon-shaped with a substantially rectangular cross-sectional configuration, said leads being approximately equal in width to the width of said contact surfaces of said crystal, said leads being directly bonded proximate one end thereof to said first and second contact surfaces in ohmic connection with substantially the entire contact surface thereof, said leads being extended from said crystal in substantially opposed parallel directions, and an esterified surface formed on said crystal, at those portions of the crystal surface not in contact with said leads, and an encapsulating moisture impervious, electrically insulating material surrounding said crystal and adjacent portions of said leads in direct contact with said crystal and leads.

7. An improved semiconductor diode comprising: a semiconductor crystal element having a P-type conductivity contact surface and an opposed substantially parallel N-type conductivity surface; first and second electrically conductive leads, each of said leads being ribbon shaped with a substantially rectangular cross-section of configuration, each of said leads being approximately equal in width to the width of said contact surface of said crystal, said leads each being directly bonded proximate one end thereof to said first and second contact surfaces respectively in ohmic connection therewith across substantially the entire surface area thereof, said leads being extended from said crystal in substantially opposed parallel directions; an esterified surface formed on said crystal at those portions of the crystal surface not in contact with said leads; and an encapsulating mass of heat stable modified-silicone varnish surrounding said crystal and adjacent portions of said leads in moisture sealing contact with the surfaces of said crystal and leads.

8. An improved semiconductor diode comprising: a semiconductor crystal element having a P-type conductivity contact surface and an opposed substantially parallel N-type conductivity surface; first and second electrical conductive leads, each of said leads being ribbon shaped with a substantially rectangular cross-sectional configuration, each of said leads being approximately equal in width to the width of said contact surface of said crystal, said leads each being directly bonded proximate one end thereof to said first and second contact surfaces respectively in ohmic connection therewith across substantially the entire surface area thereof, said leads being extended from said crystal in substantially opposed parallel directions; an esterified surface formed on said crystal at those portions of the crystal surface not in contact with said leads; and an encapsulating mass of heat stable polymer resin surrounding said crystal and adjacent portions of said leads in moisture sealing contact with the surfaces of said crystal and leads.

References Cited in the file of this patent

UNITED STATES PATENTS

| | | |
|---|---|---|
| 2,151,762 | Hitchcock | Mar. 28, 1939 |
| 2,737,618 | Eisler | Mar. 6, 1956 |
| 2,827,597 | Lidow | Mar. 18, 1958 |
| 2,842,725 | Muller | July 8, 1958 |